United States Patent

Brugge

[11] Patent Number: 5,412,250
[45] Date of Patent: May 2, 1995

[54] BARRIER ENHANCEMENT AT THE SALICIDE LAYER

[75] Inventor: Hunter B. Brugge, San Antonio, Tex.

[73] Assignee: VLSI Technology, Inc., San Jose, Calif.

[21] Appl. No.: 126,353

[22] Filed: Sep. 24, 1993

[51] Int. Cl.⁶ .......................................... H01L 23/48
[52] U.S. Cl. .................................. 257/750; 437/192; 437/200
[58] Field of Search ............... 437/200, 192, 203, 194, 437/187; 257/740, 741, 750, 751, 763, 765

[56] References Cited

U.S. PATENT DOCUMENTS

| | | |
|---|---|---|
| 4,782,380 | 11/1988 | Shankar et al. |
| 4,998,157 | 3/1991 | Yokoyama et al. |
| 5,106,781 | 4/1992 | Penning De Vries ............ 437/192 |
| 5,162,262 | 11/1992 | Ajika et al. ......................... 437/200 |
| 5,300,813 | 4/1994 | Joshii et al. ......................... 257/752 |
| 5,350,948 | 9/1994 | Maehara ............................. 257/751 |

FOREIGN PATENT DOCUMENTS

0213159  9/1987  Japan ................................... 257/751

OTHER PUBLICATIONS

J. Coniff et al. "A universal underlayer for Al and W Interconnects" Advanced Metallization for ULSI Applications, Proc. of Conf. Oct. 1991 pp. 293-296 (Abstract).

*Primary Examiner*—Olik Chaudhuri
*Assistant Examiner*—C. Everhart
*Attorney, Agent, or Firm*—Patrick T. King

[57] ABSTRACT

An improved barrier, and a method for forming such a barrier, between a semiconductor substrate and a metallized contact. A first metallic layer is deposited over the substrate and the contact well formed therein. The first metallic layer is then exposed to a gas to allow the gas to stuff the first metallic layer, thereby improving the barrier characteristics of the first metallic layer. A second metallic layer is deposited over the first stuffed metallic layer. A third metallic layer is then deposited over the second metallic layer. An anti-reflective fourth layer of metal is then deposited over the third metallic layer. The exposure of the first metallic layer to a gas and all of the metal layer deposition steps are performed in a low-pressure environment. Therefore, the present invention eliminates the need for time-consuming pressure breaks. As a result, the throughput of the present invention is substantially increased over prior art barrier formation processes. Also, as a result of subsequent processing steps required in the formation of semiconductor devices, the portions of the first metallic layer which are present outside of the contact well are removed. The remaining portion of the first metallic layer forms a self-aligned silicide within the contact well. Thus, the present invention eliminates the need for a separate etch step to remove unwanted portions of the first metallic layer, and also provides a self-aligned silicide without requiring a separate heating or sinter step.

39 Claims, 2 Drawing Sheets

BARRIER ENHANCEMENT AT THE SALICIDE LAYER

BACKGROUND OF THE INVENTION

1. Field of the Invention

This invention relates to semiconductor processing techniques. Specifically, the present invention relates to a processing technique for providing an enhanced barrier between a semiconductor substrate and a metallized contact.

2. Prior Art

Electrical connections to semiconductor devices formed in a semiconductor substrate are typically made using metallized contacts. In a standard process, metallized contacts are created by first forming a depression, referred to as a contact well, through an undermetal dielectric which overlies the semiconductor substrate and semiconductor devices formed thereon. The contact well is formed directly above the region to which electrical connection is to be made. For example, the contact well may extend down to a polysilicon line or even completely down to the semiconductor substrate to allow for direct electrical connection to a source or drain of a semiconductor device. Next, in an evacuated or low-pressure environment, a layer of conductive material such as platinum is sputtered over the undermetal dielectric covered substrate including the contact well. After the sputtering step, the semiconductor wafer, that is, the semiconductor substrate and all overlying materials, is removed from the low-pressure environment and placed in a furnace at an increased or atmospheric pressure. This step is referred to as a sinter. The sinter causes the platinum to react with the portion of the semiconductor substrate exposed in the contact well. The reacted platinum and exposed semiconductor substrate form a platinum silicide within the contact well. The platinum which is disposed on top of the undermetal dielectric, on the other hand, does not react during the sinter process.

Unfortunately, movement of the wafer from the low-pressure environment to the oven for the sinter is extremely time-consuming. In order to safely perform a vacuum break, that is, a transition from a low-pressure environment to a much higher pressure environment, the pressure must be very meticulously and slowly changed. An abrupt or rapid change in pressure creates turbulence which in turn may disrupt dust or other contaminating particles within the low-pressure environment. If the disrupted particles contact the semiconductor devices, shorts or defects in the devices may result. Therefore, any changes in pressure must be gradually and gently carried out. As a result, the movement of the wafer from the low-pressure sputter environment to the much higher pressure oven environment must be performed over an extended period of time.

In the typical metallized contact formation process, following the sinter, an etch step such as, for example, an aqua regia strip using a combination of nitric and hydrochloric acid is used to remove the unreacted platinum remaining on top of the undermetal dielectric. The platinum silicide, or reacted platinum, is not affected by the aqua regia strip and, thus, remains intact within the contact well.

Due to the nature of the platinum silicide, no oxidation of the silicide occurs while the wafer is exposed to air during the aqua regia strip. Therefore, the platinum silicide does not provide a barrier over the contact well. That is, if the layer of electrically conductive material used as the conductor in the metallized contact is placed on top of the platinum silicide, unwanted diffusion of the conductor material through the silicide and into the semiconductor substrate will occur. To provide a sufficient diffusion barrier between the contact well and the conductor material, the wafer is returned to the low-pressure sputter environment and a metallic barrier layer is sputtered over the undermetal dielectric and the contact well containing the platinum silicide.

Commonly, the wafer is then subjected to another vacuum break and is exposed to air at atmospheric pressure. In so doing, an oxide is formed on the metallic barrier layer. The oxidized metallic barrier layer is intended to prevent diffusion of the conductor material into the semiconductor substrate.

Next, the wafer is again returned to the low-pressure environment and the layer of conductor material is sputtered over the oxidized metallic barrier layer. The layer of conductor material is then covered with a protective coating. After completion of the above-described steps, formation of the metallized contacts is completed. The wafer then undergoes additional process steps including inter-metal oxide deposition steps, wherein the fabrication of the semiconductor devices on the semiconductor substrate is completed.

As set forth above, conventional metallized contact formation techniques require numerous process steps involving several vacuum breaks. Unfortunately, each of the process steps required in the formation of the metallized contacts has a cost associated therewith. Thus, the cost of a metallized contact manufactured using conventional formation techniques is compounded by the numerous process steps. Additionally, due to the amount of time required for each vacuum break, wafer throughput is significantly reduced. Furthermore, the numerous process steps and required transportation of the wafer from one environment to another necessitates repeated wafer handling. As a result, defects associated with wafer handling are also prevalent in wafers having contacts formed using conventional metallized contact formation techniques.

Thus, the need has arisen for a metallized contact, and a method for forming such a contact, which reduces the amount of required process steps, does not require numerous vacuum breaks, and eliminates the need for substantial wafer handling.

SUMMARY OF THE INVENTION

It is therefore an object of the present invention to provide a metallized contact, and a method for forming such a contact, having a reduced manufacturing cost, an increased wafer throughput, and minimal wafer handling defect. The above object has been achieved by a metallized contact, and a method for forming such a contact, which eliminates several process stops used in conventional metallized contact formation techniques, allows the entire metallized contact formation process to occur without any vacuum breaks, and significantly reduces wafer handling and defects associated therewith.

In the present invention, a first metallic layer is deposited over a substrate, and a contact well formed therein, within a low-pressure environment. A gas is then introduced into the low-pressure environment to allow the gas to react with the first metallic layer, thereby improving the barrier characteristics of the first metallic layer. This reaction is referred to as barrier "stuffing." A second metallic layer is then deposited over the first metallic layer. Next, a third metallic layer is then deposited over the second metallic layer. Finally, an anti-reflective fourth layer of metal is then deposited over the third metallic layer.

In so doing, the present invention eliminates the need for time-consuming vacuum breaks. As a result, the throughput of the present invention is substantially increased over prior art barrier formation processes. Also, as a result of subsequent processing steps required in the formation of semiconductor devices, the portions of the first metallic layer which are present outside of the contact well are removed. The remaining portion of the first metallic layer forms a self-aligned silicide within the contact well. Thus, the present invention eliminates the need for a separate etch step to remove unwanted portions of the first metallic layer, and also provides a self-aligned silicide without requiring a separate heating or sinter step. Additionally, by performing all of the process steps within a single low-pressure environment, the amount of wafer handling is significantly reduced compared to conventional metallized contact formation processes.

Therefore, the present invention provides a metallized contact and a method for forming such a contact, which has a reduced manufacturing cost, increased wafer throughput, and minimal wafer handling defects.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be de, scribed in conjunction with the preferred embodiments, it will be understood that they are not intended to limit the invention these embodiments. On the contrary, the invention is intended to cover alternatives, modifications and equivalent, which may be included within the spirit and scope of the invention as defined by the appended claims.

Figure 1A:
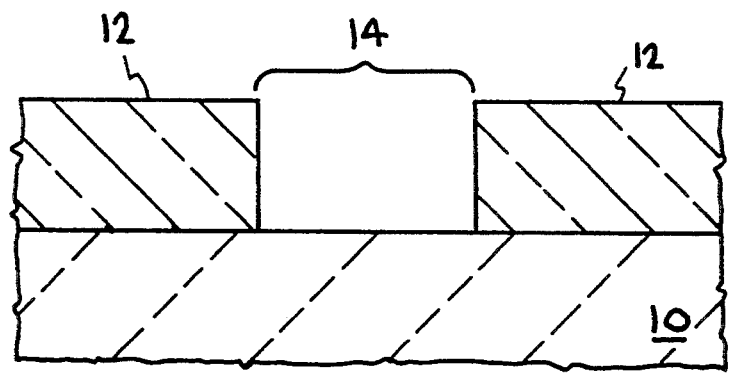
FIGS. 1A–1E are side sectional views of the steps used in the formation of the metallized contact in accordance with the present invention.

With reference now to FIG. 1A, a starting step in the formation of a metallized contact is shown in accordance with the present claimed invention. A semiconductor substrate 10 is shown having an under-metal dielectric 12 disposed on the Lop surface thereof. In the present embodiment, semiconductor substrate 10 is formed of silicon. However, the present invention is also well-suited to the use of other semiconductor substrates well known in the arc. Undermetal dielectric 12 serves as a protective layer over semiconductor substrate 10. In the present embodiment, under-metal dielectric 12 is formed of boro-phospho-silicate-glass, BPSG, although any of the numerous protective coatings well known in the art would also be suit aisle for use in the present claimed invention. As shown in FIG. 1A, an old thing 14 is formed from the top surface of BPSG layer 12 extending downward completely to the top surface of silicon substrate 10. Opening 14 is referred to as a "contact well" and is formed using any of the numerous suitable etching techniques well known in the art.

Referring now to FIG. 1A, the next step in the formation of a metallized contact in accordance with the present claimed invention is shown. In a low-pressure environment, a layer of titanium 16 is deposited over silicon substrate 10, including BPSG layer 12, and contact well region 14. The deposition of titanium layer 16 occurs in a low-pressure environment. In the present embodiment, the low-pressure environment, wherein the titanium deposition takes place, is maintained at approximately $2.0 \times 10^{-3}$ Torr. However, alternate pressures which allow for the effective deposition of titanium layer 16 onto silicon substrate 10 are also suitable for use with the methods of the present claimed invention. Additionally, in the present embodiment, titanium layer 16 is deposited having a thickness in the range of approximately 200–1000 angstroms. Although titanium layer 16 is deposited to such a thickness in the present embodiment, other thicknesses can also be used with the methods of the present invention.

Figure 1B:
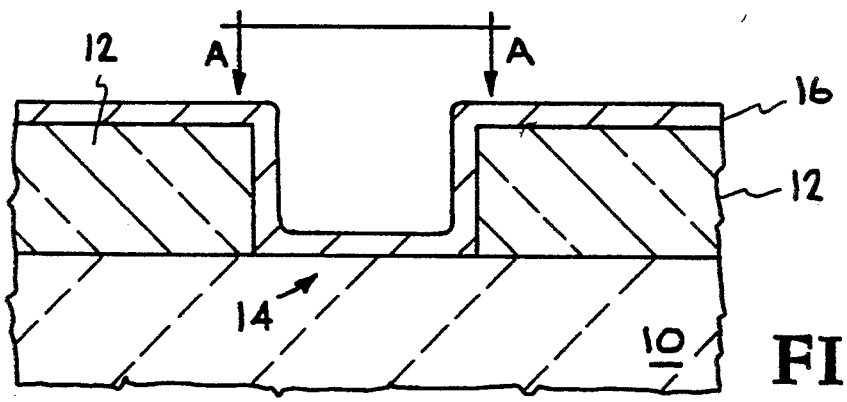

Referring still to FIG. 1B, after the deposition of titanium layer 16, nitrogen gas is introduced into the low-pressure environment. The nitrogen gas fills in or "stuffs" the gaps present between the molecules of titanium layer 16. In so doing, nitrogen "stuffed" titanium layer 16 provides an enhanced barrier above silicon substrate 10 within contact well 14. Furthermore, although titanium is used in the present embodiment, other materials which are well known in the art may also be used. However, as described below, due to the nature and molecular composition of titanium, specific advantages are realized by using titanium for layer 16.

Figure 2A:
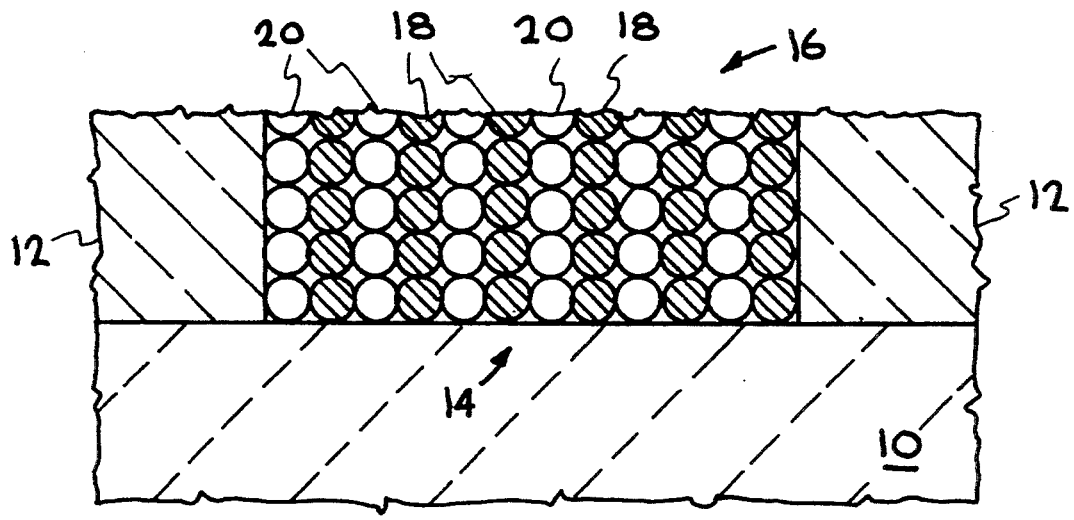
FIG. 2A is an enlarged cut-away side sectional view of a titanium layer taken along line A—A of FIG. 1B in accordance, with the present invention.

With reference now to FIG. 2A, a simplified depiction of an enlarged cutaway side view of titanium layer 16 taken along line A—A of FIG. 1B is shown. FIG. 2A illustrates the physical characteristics of titanium layer 16 after the deposition shown in FIG. 1B is completed. As shown in FIG. 2A, the molecular structure of titanium layer 16 is such that a "columnar" shape or pattern is produced. The columns 18 comprising titanium layer 16 are separated by spaces 20. As can be seen from FIG. 2A, spaces 20 if left untilled might allow materials, specifically conductive materials such as, for example aluminum, deposited on top of titanium layer 16, to diffuse between columns 18 and approach the top surface of silicon substrate 10.

Figure 2B:
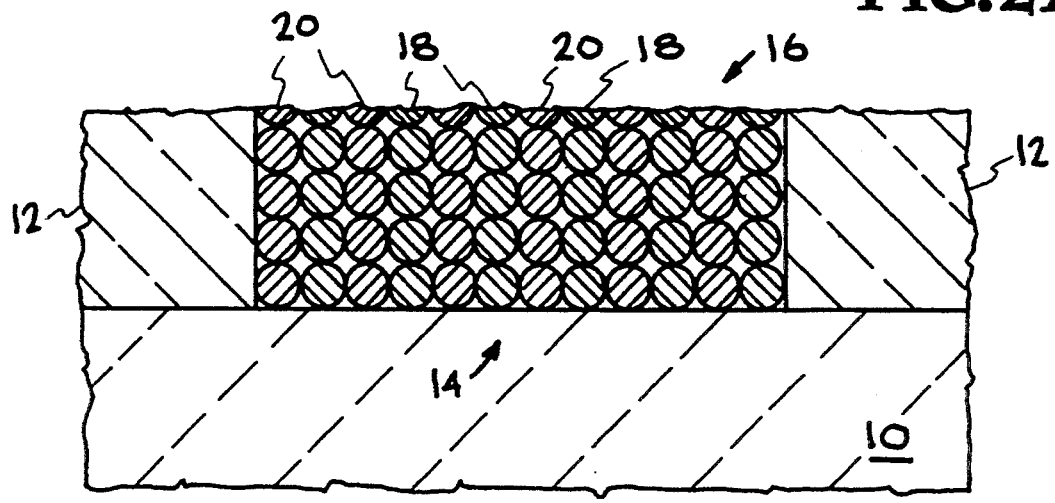
FIG. 2B is an enlarged cut-away side sectional view of a titanium layer taken along line A—A of FIG. 1B wherein the titanium layer is stuffed with nitrogen in accordance with the present invention.

Referring now to FIG. 2B, the spaces 20 between columns 18 of titanium layer 16 are shown as being "stuffed" with nitrogen. FIG. 2B illustrates the physical characteristics of titanium layer 16 after layer 16 has been exposed to the nitrogen. As can be soon in FIG. 2B, the nitrogen "stuff" or closes spaces 20 of titanium layer 16, thereby providing an enhanced barrier over silicon substrate 10 in contact well 14. In so doing, the diffusion of materials to be deposited over titanium layer 16, specifically aluminum, through titanium layer 16 and into silicon substrate 10 can be reduced. Although nitrogen is used to stuff titanium layer 16 in the present embodiment, other gases such as, for example, air may also be used. Additionally, if a gas which contains oxygen, is exposed to the titanium layer, the amount of oxidation can be controlled. That is, in the present invention the amount of time during which titanium layer 16 is exposed to the gas, the composition of the gas, and the pressure under which titanium layer 16 is exposed to the gas may be precisely controlled. As a result, titanium layer 16 can be completely stuffed without completely oxidizing titanium layer 16.

Figure 1C:
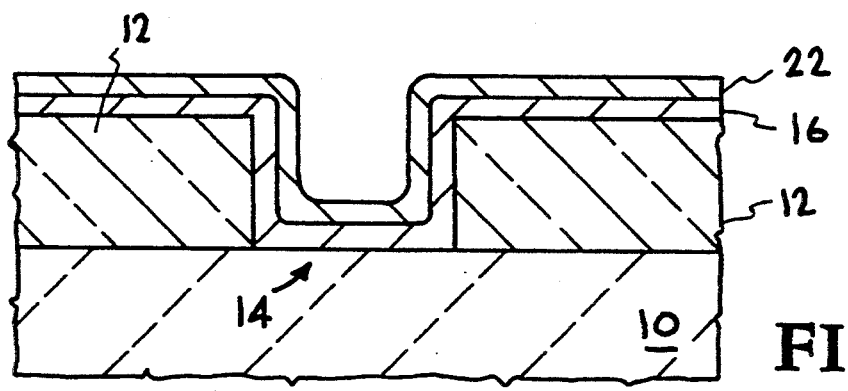

With reference now to FIG. 1C, a titanium-tungsten alloy layer 22 is then deposited over titanium layer 16. In the present embodiment, the titanium-tungsten alloy is comprised of 90% tungsten and 10% titanium. However, variations in the composition of the alloy are also well suited to the methods of the present claimed invention. Furthermore, in the present embodiment, titanium-tungsten alloy layer 22 is deposited to a thickness of approximately 2000 angstroms. Although titanium-tungsten alloy layer 22 is deposited to such a thickness in the present embodiment, other thicknesses can also be used with the methods of the present invention. Also in the present claimed invention, the deposition of titanium-tungsten alloy layer 22 is performed within the same low-pressure environment used previously. As such, no vacuum break is required between depositing titanium layer 16, exposing layer 16 to nitrogen gas, and depositing titanium-tungsten ahoy layer 22 on titanium layer 16.

Figure 1D:
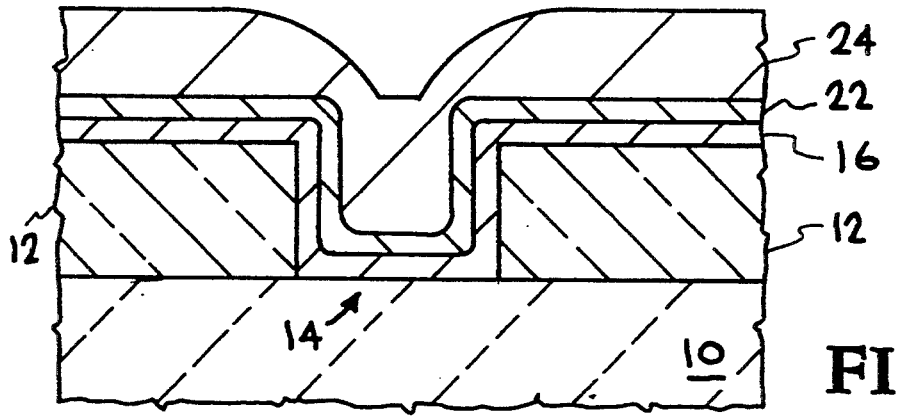

Referring next to FIG. 1D, a conductive aluminum-copper alloy layer 24 is then deposited over titanium-tungsten alloy layer 22. In the present embodiment, the conductive aluminum-copper alloy is comprised of 99% aluminum and 1% copper. However, variations in the composition of the aluminum-copper alloy, and the use of different alloys are also well suited to the methods of the present claimed invention. Furthermore, in the present embodiment, conductive aluminum-copper ahoy layer 24 is deposited to a thickness of approximately 4000 angstroms. Although aluminum-copper alloy layer 24 is deposited to such a thickness in the present embodiment, other thicknesses can also be used with the methods of the present invention. Also in the present claimed invention, the deposition of conductive aluminum-copper alloy layer 24 is performed within the same low-pressure environment used previously.

Figure 1E:
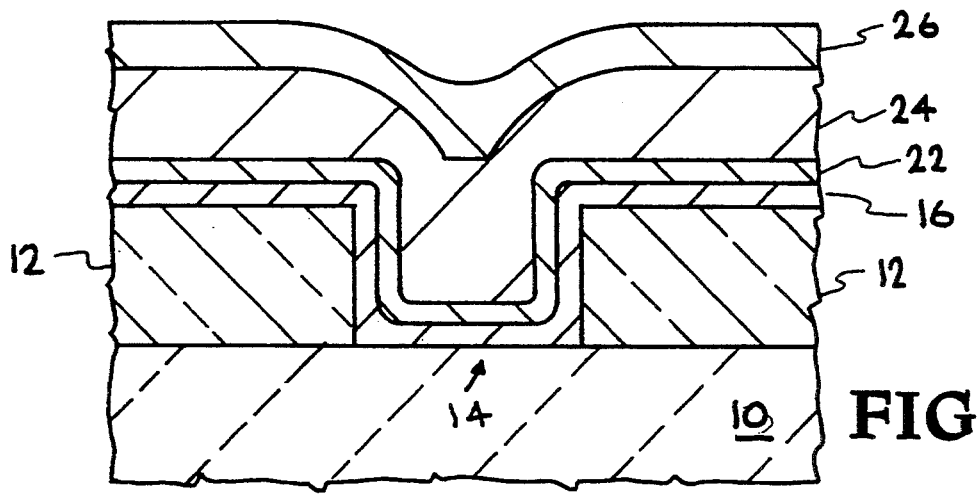

With reference next to FIG. 1E, a titanium-tungsten alloy layer 26 is deposited over conductive aluminum-copper alloy layer 24. Titanium-tungsten alloy layer 26 is comprised of 90% tungsten and 10% titanium. However, variations in the composition of the alloy are also well suited to the methods of the present claimed invention. Furthermore, in the present embodiment, titanium-tungsten alloy layer 26 is deposited to a thickness in the range of approximately 400–1000 angstroms. Additionally, in the present embodiment, titanium-tungsten alloy layer 26 acts as an anti-reflective coating, so that subsequent photolithography steps can be precisely controlled. That is, the line resolution which can be achieved during subsequent photolithography steps is thereby improved. Again, the deposition of titanium-tungsten alloy layer 26 is performed within the same low-pressure environment used previously for all other deposition steps.

With reference still to FIG. 1E, a further benefit is also gained by depositing titanium-tungsten alloy layer 26 over conductive aluminum-copper alloy layer 24. Conductive aluminum-copper alloy layer 24 has an intrinsic tensile stress. Titanium-tungsten alloy layers 22 and 26, on the other hand, are compressive stress films. Therefore, by "sandwiching" conductive aluminum-copper alloy layer 24 between titanium-tungsten alloy layers 22 and 26, physical migration of aluminum-copper alloy layer 24 is suppressed. That is, if heating of the deposited layers occurs, titanium-tungsten alloy layers 22 and 26 "hold" conductive aluminum-copper alloy layer 24 so that layer 24 does not buckle during expansion. By preventing buckling of conductive aluminum-copper alloy layer 24, the present claimed invention reduces defects such as shorts found in prior art metallized contacts.

After the deposition of titanium-tungsten alloy layer 26, subsequent processing steps, which are well known in the art, are performed. These well known steps including removing the deposited layers 16, 22, 24, and 26 from a portion of BPSG layer 12. Other well known typical steps include second metal depositions and oxide deposition steps referred to as inter-metal oxide deposition steps. During the subsequent processing steps including the inter-metal oxide deposition steps, silicon substrate 10 and all subsequently deposited overlayers, 12, 16, 22, 24, and 26 are subjected to temperatures of approximately 400–500 degrees centigrade. During this heating, titanium layer 16 reacts with silicon substrate 10 to form a titanium silicide. Furthermore, because titanium layer 16 is deposited over contact well 14 using a blanket deposition, the titanium silicide which is formed is a self-aligned silicide. As a result, the present claimed invention provides for the formation of a silicide (self-aligned silicide) without requiring a separate sinter step as set forth in conventional metallized contact formation processes. That is, by using titanium layer 16, the heat of subsequent processing steps causes a reaction to occur which is similar to the reaction which forms a platinum silicide in prior art contact formation processes. However, unlike conventional or prior art processes, the present invention does not require a separate sinter step. Therefore, not only is a process step eliminated by the present claimed invention, but the need for a time-consuming vacuum break is also eliminated.

Additional benefits are also realized by the metallized contact, and the method for forming such a contact, set forth in the present claimed invention. In prior art processes, a separate aqua regia strip was required after the deposition and sinter of the platinum layer. As stated above, the present claimed invention has already eliminated the need for a separate sinter step. As a further improvement over the prior art, the present claimed invention also eliminates the need for an aqua regia strip. Due to the nature of platinum, the subsequent processing steps which include the removal of deposited metal layers from unwanted areas would not remove the platinum from unwanted areas. Therefore, in the prior art, a separate aqua regia strip was required to remove the platinum from unwanted areas. However, due to the nature of titanium layer 16, it is removed from unwanted areas during the subsequent processing steps. That is, since titanium is a component of titanium-tungsten alloy layer 22, when titanium-tungsten alloy layer 22 is subjected to a metal etch as one of the subsequent processing steps, titanium layer 16 is also effectively removed from unwanted areas. Thus, the present claimed invention eliminates the need for a separate etch or aqua regia strip required in conventional metallized contact formation techniques.

The present claimed invention provides a metallized contact which can be formed without a vacuum break. By eliminating the numerous vacuum breaks required by conventional metallized contact formation processes, the amount of time necessary to form a metallized contact can be dramatically decreased. As a result, the present claimed invention is able to achieve a throughput far greater than has previously been possible. Also, by eliminating the need to repeatedly transfer a wafer from one environment to another, the present claimed invention significantly reduces the amount of wafer handling compared to prior art techniques. Thus, the present claimed invention reduces the incidence of defects associated with wafer handling. Furthermore, the present claimed invention eliminates numerous process steps found in prior art metallized contact formation techniques. As each of the eliminated process steps has a cost associated therewith, the present claimed invention also reduces the manufacturing cost to form a metallized contact.

In summary, the present claimed invention provides a metallized contact, and a method for forming such a contact, which eliminates several process steps used in conventional metallized contact formation techniques, and the costs associated therewith, allows the entire metallized contact formation process to occur without any vacuum breaks, and significantly reduces wafer handling and wafer handling defects.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular rise contemplated. It is intended that the scope of the invention be defined by the Claims appended hereto and their equivalents.

It is claimed:

1. An improved method for forming a barrier between a metallized contact and a semiconductor substrate comprising the steps of:

depositing a first metallic layer over a portion of said semiconductor substrate with said first metallic layer deposited into a contact well formed into said portion of semiconductor substrate, said deposition of said first metallic layer performed in a low pressure environment, exposing said first layer of metallic material to a gas, said exposure of said first metallic layer to said gas performed in said low pressure environment, depositing a second metallic layer over said semiconductor substrate with said first metallic layer is disposed between said semiconductor substrate and said second metallic layer, said deposition of said second metallic layer performed in said low pressure environment, depositing a third metallic layer over said second metallic layer with said second metallic layer disposed between said first and third metallic layers such that said barrier comprised of said first and second metallic layers minimizes diffusion of said third metallic layer into said semiconductor substrate, said deposition of said third metallic layer performed in said low pressure environment, depositing a fourth metallic layer over said third metallic layer with said third metallic layer disposed between said second and fourth metallic layers, said deposition of said forth metallic layer performed in said low pressure environment.

2. The improved barrier forming method as recited in claim 1 wherein said stop of exposing said first metallic layer to said gas comprises introducing nitrogen gas into said low-pressure environment.

3. The improved barrier forming method as recited in claim 1 wherein said stop of exposing said first metallic layer to said gas comprises introducing air into said low-pressure environment.

4. The improved barrier forming method as recited in claim 1 wherein said step of depositing said first metallic layer comprises depositing a metallic layer having a thickness of approximately 200 angstroms.

5. The improved barrier forming method as recited in claim 1 wherein said step of depositing said second metallic layer comprises depositing a metallic layer having a thickness of approximately 2000 angstroms over said first metallic layer.

6. The improved barrier forming method as recited in claim 1 wherein said step of depositing said third metallic layer comprises depositing a metallic layer having a thickness of approximately 4000 angstroms over said second metallic layer.

7. The improved barrier forming method as recited in claim 1 wherein said step of depositing said fourth metallic layer comprises depositing a metallic layer having a thickness of approximately 400 angstroms over said third metallic layer.

8. The improved barrier forming method as recited in claim 1 wherein said step of depositing said first metallic layer comprises depositing a layer of titanium over said semiconductor substrate and into said contact well formed therein.

9. The improved barrier forming method as recited in claim 1 wherein said step of depositing said second metallic layer comprises depositing a layer of a titanium-tungsten alloy over said first metallic layer.

10. The improved barrier forming method as recited in claim 1 wherein said step of depositing said third metallic layer comprises depositing a layer of an aluminum-copper alloy over said second metallic layer.

11. The improved barrier forming method as recited in claim 1 wherein said step of depositing said fourth metallic layer comprises depositing a layer of a titanium-tungsten alloy over said third metallic layer.

12. The improved barrier forming method as recited in claim 11 wherein said titanium-tungsten alloy layer deposited over said third metallic layer is anti-reflective.

13. The improved barrier forming method as recited in claim 1 wherein said first metallic layer is removed as said semiconductor substrate undergoes subsequent processing steps required for fabrication of semiconductor devices on said semiconductor substrate, such that no separate etch step is required to remove said first metallic layer from regions outside of said contact well.

14. The improved barrier forming method as recited in claim 1 wherein said first metallic layer forms a self-aligned silicide as said semiconductor substrate is heard during subsequent processing steps required for fabrication of semiconductor devices on said semiconductor substrate, such that no separate heating step is required to form said silicide in said contact well of said semiconductor substrate.

15. The improved barrier forming method as recited in claim 1 wherein said first metallic layer forms a self-aligned silicide as said semiconductor substrate is heated during subsequent processing steps required for fabrication of semiconductor devices on said semiconductor substrate.

16. A method for forming, in a low-pressure environment, a barrier between a metallized contact and an underlying material comprising the steps of:
   a.) depositing a layer of titanium over a portion of said underlying material including a contact well formed into said material,
   b.) exposing said titanium layer to a gas such that said gas stuffs said layer of titanium,
   c.) depositing a first layer of a titanium-tungsten alloy over said stuffed layer of titanium, such that said stuffed layer of titanium is disposed between said underlying material and said first layer of said titanium-tungsten alloy,
   d.) depositing a layer of an aluminum-copper alloy over said first layer of said titanium-tungsten alloy with said first layer of said titanium-tungsten alloy disposed between said stuffed layer of titanium and said layer of said aluminum-copper alloy such that diffusion of said aluminum-copper alloy into said underlying material is minimized by said barrier comprised of said stuffed layer of titanium and said first layer of said titanium-tungsten alloy
   e.) depositing a second layer of a titanium-tungsten alloy over said layer of said aluminum-copper alloy, such that said layer of said aluminum-copper alloy is disposed between said first layer of said titanium-tungsten alloy and said second layer of said titanium-tungsten alloy, all of steps a.)–e.) performed in a low pressure environment and without requiring a vacuum break.

17. The barrier forming method as recited in claim 16 wherein said step of exposing said layer of titanium to said gas comprises exposing said layer of titanium to nitrogen gas introduced into said low-pressure environment.

18. The barrier forming method as recited in claim 16 wherein said step of exposing said layer of titanium to said gas comprises exposing said layer of titanium to air introduced into said low-pressure environment.

19. The barrier forming method as recited in claim 16 wherein said step of depositing said first layer of titanium comprises depositing a layer of titanium having a thickness of approximately 200 angstroms.

20. The barrier forming method as recited in claim 16 wherein said step of depositing said first layer of said titanium-tungsten alloy comprises depositing a layer of said titanium-tungsten alloy having a thickness of approximately 2000 angstroms.

21. The barrier forming method as recited in claim 16 wherein said step of depositing said layer of said aluminum-copper alloy comprises depositing a layer of said aluminum-copper alloy having a thickness of approximately 4000 angstroms.

22. The barrier forming method as recited in claim 16 wherein said step of depositing said second layer of said titanium-tungsten alloy comprises depositing a layer of said titanium-tungsten alloy having a thickness of approximately 400 angstroms.

23. The barrier forming method as recited in claim 22 wherein said second titanium-tungsten alloy layer deposited over said third metallic layer is anti-reflective.

24. The barrier forming method as recited in claim 16 wherein said layer of titanium is removed as subsequent processing steps required for fabrication of semiconductor devices are performed, such that no separate etch step is required to remove said layer of titanium from unwanted areas on said underlying material.

25. The barrier forming method as recited in claim 16 wherein said layer of titanium forms a self-aligned silicide as subsequent processing steps required for fabrication of semiconductor devices are performed, such that no separate heating step is required to form said silicide in said contact well of said underlying material.

26. The barrier forming method as recited in claim 16 wherein said underlying material is formed of polysilicon.

27. The barrier forming method as recited in claim 16 wherein said underlying material is formed of semiconductor material.

28. An enhanced barrier between a metallized contact and a semiconductor substrate formed in a low pressure environment without requiring a vacuum break comprising:
   a contact well formed into a portion of said semiconductor substrate,
   a first metallic layer disposed over said portion of said semiconductor substrate such that said first metallic layer overlies said contact well formed into said portion of semiconductor substrate, said first metallic layer stuffed with a gas such that said first metallic layer is resistive to diffusion of metal therethrough,
   a second metallic layer disposed over said semiconductor substrate such that said first metallic layer is disposed between said semiconductor substrate and said second metallic layer,
   a third metallic layer disposed over said second metallic layer with said second metallic layer disposed between said first and third metallic layers such that said barrier comprised of said first and second metallic layers minimizes diffusion of said third metallic layer into said semiconductor substrate,
   a fourth metallic layer disposed over said third metallic layer such that said third metallic layer is disposed between said second and fourth metallic layers.

29. The enhanced barrier of claim 28 wherein said first metallic layer is stuffed with nitrogen gas.

30. The enhanced barrier of claim 28 wherein said first metallic layer is stuffed with air.

31. The enhanced barrier of claim 28 wherein said first metallic layer has a thickness of approximately 200 angstroms.

32. The enhanced barrier of claim 28 wherein said second metallic layer has a thickness of approximately 2000 angstroms.

33. The enhanced barrier of claim 28 wherein said third metallic layer has a thickness of approximately 4000 angstroms.

34. The enhanced barrier of claim 28 wherein said fourth metallic layer has a thickness of approximately 400 angstroms.

35. The enhanced barrier of claim 28 wherein said first metallic layer is comprised of titanium.

36. The enhanced barrier of claim 28 wherein said second metallic layer is comprised of a titanium-tungsten alloy.

37. The enhanced barrier of claim 28 wherein said third metallic layer is comprised of an aluminum-copper alloy.

38. The enhanced barrier of claim 28 wherein said fourth metallic layer is comprised of a titanium-tungsten alloy.

39. The enhanced barrier of claim 28 wherein said fourth metallic layer is anti-reflective.

* * * * *